United States Patent [19]
Cunningham

[11] 3,952,259
[45] Apr. 20, 1976

[54] GAIN CONTROL APPARATUS
[75] Inventor: Vernon R. Cunningham, Melissa, Tex.
[73] Assignee: Rockwell International Corporation, El Segundo, Calif.
[22] Filed: Apr. 28, 1975
[21] Appl. No.: 572,574

[52] U.S. Cl. .................................. 330/29; 330/87; 330/146
[51] Int. Cl.² .................................... H03G 3/30
[58] Field of Search ................. 330/29, 32, 146, 87

[56] References Cited
UNITED STATES PATENTS
3,123,779  3/1964  Stumpers et al. ................. 330/69
3,688,129  8/1972  Ishigaki et al. .................... 330/29 X Primary Examiner—James B. Mullins
Attorney, Agent, or Firm—Bruce C. Lutz; Robert J. Crawford

[57] ABSTRACT

A circuit for providing AC gain control while minimizing the change in AC impedance and eliminating any effects on DC biasing of following stages.

6 Claims, 3 Drawing Figures

GAIN CONTROL APPARATUS

THE INVENTION

The present invention is generally related to electronics and more specifically related to a DC gain control apparatus for controlling the AC gain of a signal path through the circuit.

Prior art DC gain control circuits have incorporated various designs of differential amplifiers where minimal effect on AC impedance is desired or if AC impedance variation and DC bias variation can be tolerated, simple series variable resistor circuits have been used. However, the differential amplifier approach utilized many additional components over that required in the present invention and the use of a simple variable resistor affects the DC bias of following stages and may produce large variations in AC impedance levels. Thus, many circuits cannot stand such an approach. A further approach is to use a capacitor coupled gain control but this capacitor circuit may provide undesirable response deviations which prevent it from being usable.

The present invention utilizes a voltage divider circuit to establish the same DC bias level for the following stage as was provided on the output of the preceding stage. Then, a variable resistor is inserted between the output of the preceding stage and the voltage divider wherein the voltage divider provides a paralleled low output impedance which is only minimally affected by the series variable resistor. Thus, the output impedance of the total circuit remains substantially constant.

It is therefore an object of the present invention to provide an improved DC gain control circuit.

Other objects and advantages of the present invention may be ascertained by a reading of the specification and appended claims in conjunction with the drawings wherein:

DETAILED DESCRIPTION

Figure 1:
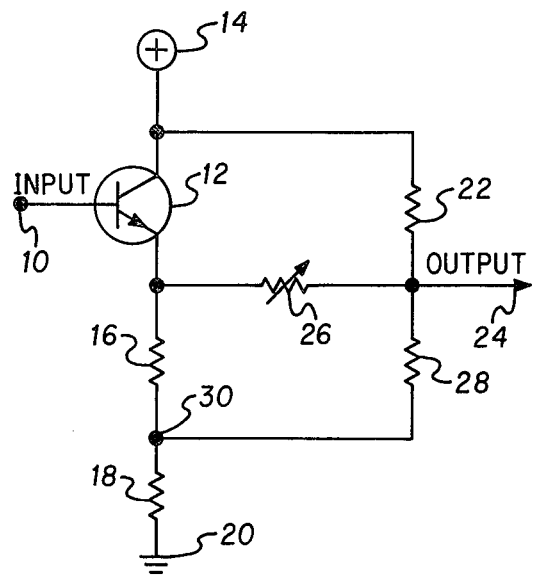
FIG. 1 is a schematic diagram of the most basic version of the circuit.

In FIG. 1, an input terminal 10 provides input signals to a NPN transistor generally designated as 12 having a collector connected to a positive power supply 14 and an emitter connected through a first resistor 16 and a second resistor 18 to ground or reference potential 20. A resistor 22 is connected between positive terminal 14 and an output terminal generally designated as 24. A variable resistor or potentiometer 26 is connected between the emitter of transistor 12 and output 24. A further resistor 28 is connected between output 24 and a junction 30 between resistors 16 and 18.

Figure 2:
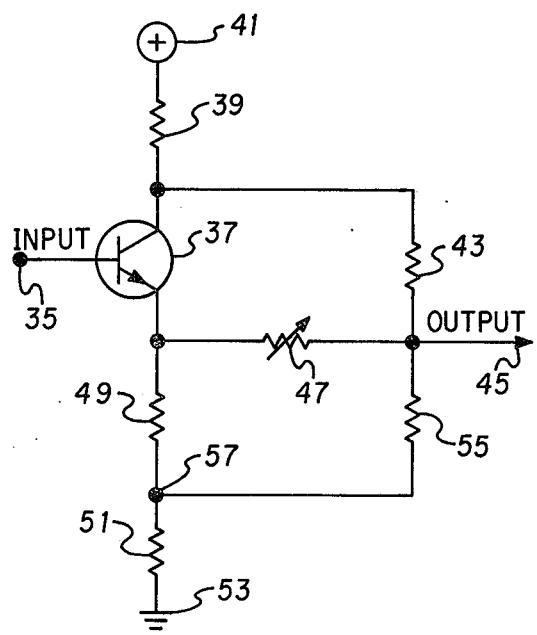
FIG. 2 is a schematic diagram of a preferred embodiment of the invention.

In FIG. 2, an input generally designated as 35 is connected to the base of a NPN transistor generally designated as 37 having its collector connected through a resistor 39 to a positive source of power 41. This collector is also connected through a resistor 43 to an output designated as 45. An emitter of transistor 37 is connected to one end of a variable resistor or potentiometer 47 having its other end connected to output 45. The emitter is also connected through a first resistor 49 and a second resistor 51 to ground or reference potential 53. A final resistor 55 is connected between output 45 and a junction point 57 between resistors 49 and 51.

Figure 3:
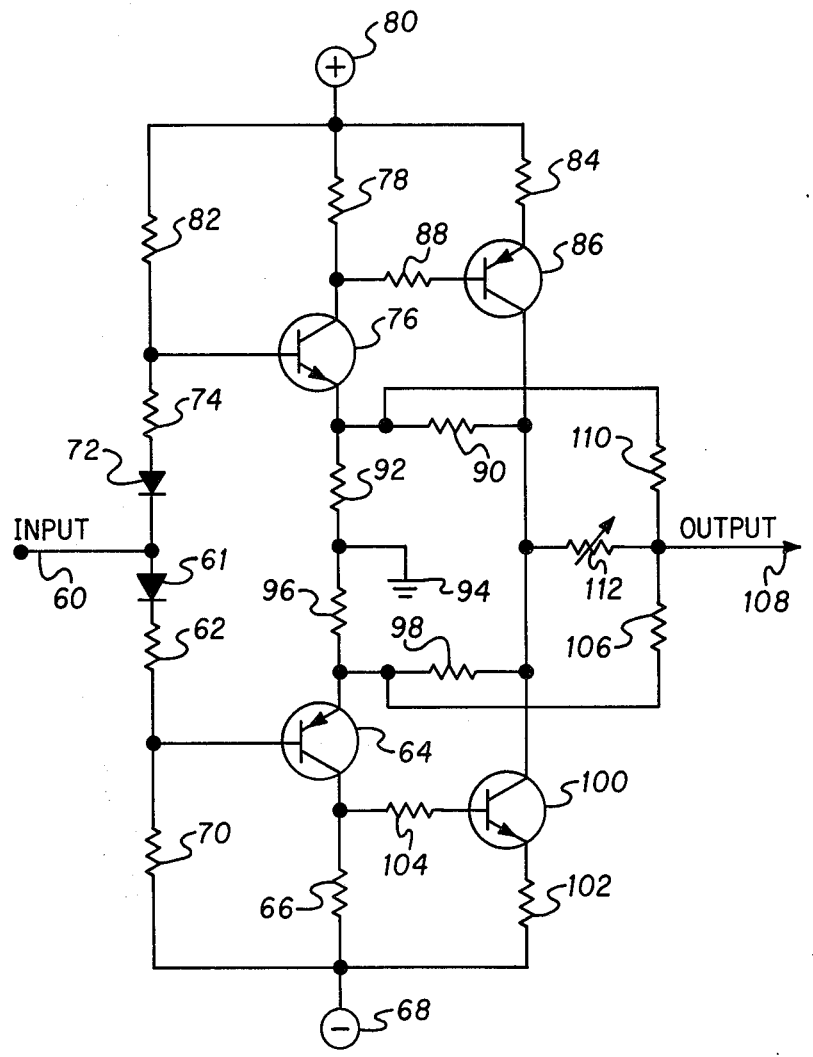
FIG. 3 is a schematic diagram of the inventive concept incorporated in a double-ended to single-ended output circuit.

In FIG. 3, an input terminal 60 is connected to provide input signals through a diode 61 and a resistor 62 to a base of a PNP transistor generally designated as 64 and having its collector connected through a resistor 66 to a negative power source 68. A resistor 70 is connected between the base of transistor 64 and negative power terminal 68. A diode generally designated as 72 has its cathode connected to input 60 and its anode connected through a resistor 74 to a base of a NPN transistor generally designated as 76. A collector of transistor 76 is connected through a resistor 78 to a positive power source 80. A resistor 82 is connected between the base of transistor 76 and positive power source 80. A further resistor 84 is connected between power source 80 and an emitter of a PNP transistor generally designated as 86 and having its base connected through a resistor 88 to the collector of transistor collector of The collectorof transistor 86 is connected through a resistor 90 to an emitter of transistor 76. A resistor 92 is connected between the emitter of transistor 76 and ground or reference potential 94. A further resistor 96 is connected between ground 94 and an emitter of transistor 64. A resistor 98 is connected between the same emitter of transistor 64 and a collector of a NPN transistor generally designated as 100 having an emitter connected through a resistor 102 to negative power potential 68 and a base connected through a resistor 104 to the collector of transistor 64. A resistor 106 is connected from the emitter of transistor 64 to an output terminal generally designated as 108. A further resistor 110 is connected between output terminal 108 and the emitter of transistor 76. Finally, a variable resistor 112 is connected between the collectors of transistors 86 and 100 and the output terminal 108.

OPERATION

Referring now to FIG. 1, it will be noted that in normal operation without the gain control circuit, the circuit including transistor 12 would not contain resistors 22, 26 and 28. Rather, the output 24 would be connected directly to the emitter of transistor 12 and the resistor elements 16 and 18 would be combined into a single resistive unit. In this configuration, the circuit would be termed an "emitter follower" and provide a very low impedance output. The present circuit operates to bias the output 24 at the same potential as the emitter of transistor 12. Thus, there is no effect on the DC bias level of the following stage. Further, the resistor 28 provides "positive feedback" to the output and thus the resistor 26 need be only a very small value to have the required gain change on the signal levels passing therethrough.

The circuit of FIG. 2 is a very similar except that this circuit is designed wherein the resistor 43 provides an amount of "negative feedback" which is equal and opposite to the positive feedback provided by the signals coming through resistor 55. Thus, all the AC signal variation is provided by the variable resistor 47. The circuit of FIG. 2 has an advantage over the generalization of FIG. 1 in that the current required for the total circuit is less than if the resistors 43 and 55 were connected directly to the positive potential 41 and ground 53, respectively. In one embodiment of the circuit, this current was reduced by 66% from 9.76 milliamps to 3.33 milliamps.

The circuit of FIG. 3 illustrates the gain control circuit as receiving power from the emitters of transistors 76 and 64 through resistors 110 and 106 to bias the output 108 at the same potential as the collectors of transistors 86 and 100. In this embodiment, resistors 106 and 110 have equal amounts of negative feedback thus enhancing the gain change due to the resistance variations of variable resistor 112. However, the circuit operates in substantially the same fashion as FIG. 2. FIG. 3 was merely illustrated to show one of the many embodiments for which the present concept has found a use.

Other modifications of the present inventive concept will be apparent to those skilled in the art. The concept pertains to the use of a voltage divider to establish a DC potential at the output of an AC-DC gain control circuit so as to have no effect on the biasing of following stages and minimal effect on the AC output impedance as seen by the following stage. I, thus, wish to be limited to this concept only as claimed in the appended claims.

What is claimed is:

1. Gain control apparatus for providing AC gain adjustment in a DC coupled circuit intermediate a signal source and assigned load without affecting DC biasing levels consisting of:
   a signal variable resistor connected between the signal source and the signal load; and
   voltage dividing means connected to the signal load end of said signal variable resistor for maintaining the load end of said variable resistor at a common direct voltage value equal to that provided at the signal source end.

2. An amplifier stage including gain control comprising, in combination:
   first and second DC supply potential terminal means;
   stage signal input means;
   stage signal output means;
   signal amplifying transistor means including a base connected to said stage signal input means, a collector and an emitter having a given DC potential intermediate that of said first and second terminal means;
   first and second resistor means connected in series between said emitter and said second DC supply potential terminal means, and having a first intermediate point;
   third and fourth resistor means connected in series between said collector and said first intermediate point, a junction between said third and fourth resistor means forming a second intermediate point having a DC potential substantially identical with said emitter.
   means connecting said collector to said first DC potential terminal means;
   variable resistance means connected between said emitter and said second intermediate point; and
   means connecting said second intermediate point to said stage signal output means.

3. Apparatus as claimed in claim 2 wherein said means connecting said collector to said first DC terminal means is a further resistor.

4. The method of providing AC gain control between first and second DC coupled stages in a circuit without changing the DC bias of the second stage comprising, the steps of:
   varying an inserted resistance between the first and second stages; and
   maintaining the DC potential at the second stage end of the inserted resistance by voltage dividing a further DC source to a potential equivalent that at the signal source other end of the inserted resistance.

5. Gain control apparatus for providing AC gain adjustment in a DC coupled circuit intermediate a signal source and assigned load without affecting DC biasing levels consisting of:
   a signal variable resistor connected between the signal source and the signal load; and
   voltage dividing means connected to the signal load end of said signal variable resistor for maintaining the load end of said variable resistor at a common direct voltage value equal to that provided at the signal source end and for providing positive AC feedback signals to said load end of said variable resistor.

6. The method of providing AC gain control between first and second DC coupled stages in a circuit without changing the DC bias of the second stage comprising, the steps of:
   varying an inserted resistance between the first and second stages;
   maintaing the DC potential at the second stage end of the inserted resistance by voltage dividing a further DC source to a potential equivalent that at the signal source other end of the inserted resistance; and
   providing a positive AC feedback signal to the second stage end of said inserted resistance.

* * * * *